United States Patent [19]

Baeuerle

[11] Patent Number: 4,663,826

[45] Date of Patent: May 12, 1987

[54] METHOD FOR GENERATING A CONDUCTIVE REGION ON A SURFACE OF A BODY OF DIELECTRIC MATERIAL

[76] Inventor: Dieter Baeuerle, Oberklammer Str. 47, A4203 Altenberg/Linz, Austria

[21] Appl. No.: 779,058

[22] Filed: Sep. 23, 1985

[30] Foreign Application Priority Data

Oct. 9, 1984 [DE] Fed. Rep. of Germany ....... 3437072

[51] Int. Cl.$^4$ .................... H01L 21/265; H01L 7/18; B23K 9/00
[52] U.S. Cl. .................. 29/571; 29/576 B; 29/591; 148/1.5; 148/187; 148/DIG. 93; 148/DIG. 140; 156/643; 357/91; 427/43.1; 427/53.1
[58] Field of Search ............. 29/571, 576 B, 591; 148/1.5, 187; 427/43.1, 53.1; 357/91; 156/643

[56] References Cited

U.S. PATENT DOCUMENTS

| | | | |
|---|---|---|---|
| 3,601,576 | 9/1968 | Schiafli | 219/121 L |
| 4,258,078 | 3/1981 | Celler et al. | 427/43.1 |
| 4,261,764 | 4/1981 | Narayan | 148/1.5 |
| 4,348,263 | 9/1982 | Draper et al. | 148/DIG. 93 |
| 4,443,493 | 4/1984 | Delfino | 427/53.1 |
| 4,457,950 | 7/1984 | Fujita et al. | 427/53.1 |
| 4,496,607 | 1/1985 | Mathias | 427/53.1 |
| 4,542,037 | 9/1985 | Delfino | 427/53.1 |
| 4,572,843 | 2/1986 | Saito et al. | 427/53.1 |

FOREIGN PATENT DOCUMENTS

| | | | |
|---|---|---|---|
| 0021087 | 5/1980 | European Pat. Off. | |
| 0142627 | 7/1981 | Japan | 148/DIG. 93 |

OTHER PUBLICATIONS

Bermudez, Jour. Vac. Sci. Technol. 20 (1982) 51.
Antonini et al., Thin Solid Films, 125 (Mar. 1985), p. 187.

*Primary Examiner*—Upendra Roy
*Attorney, Agent, or Firm*—Hill, Van Santen, Steadman & Simpson

[57] ABSTRACT

A method for generating an area of increased conductivity on the surface of a body of dielectric material, such as for the purpose of attaching electrodes or other electrical interconnections to the area includes the steps of enclosing the surface within a reducing atmosphere and irradiating the portion of the surface corresponding to the desired conductive area with laser radiation for a selected period of time. The atmosphere may be a hydrogen atmosphere at a pressure in the range of 0-1000 HPa. Additionally, the surface may be preheated prior to irradiation.

17 Claims, 1 Drawing Figure

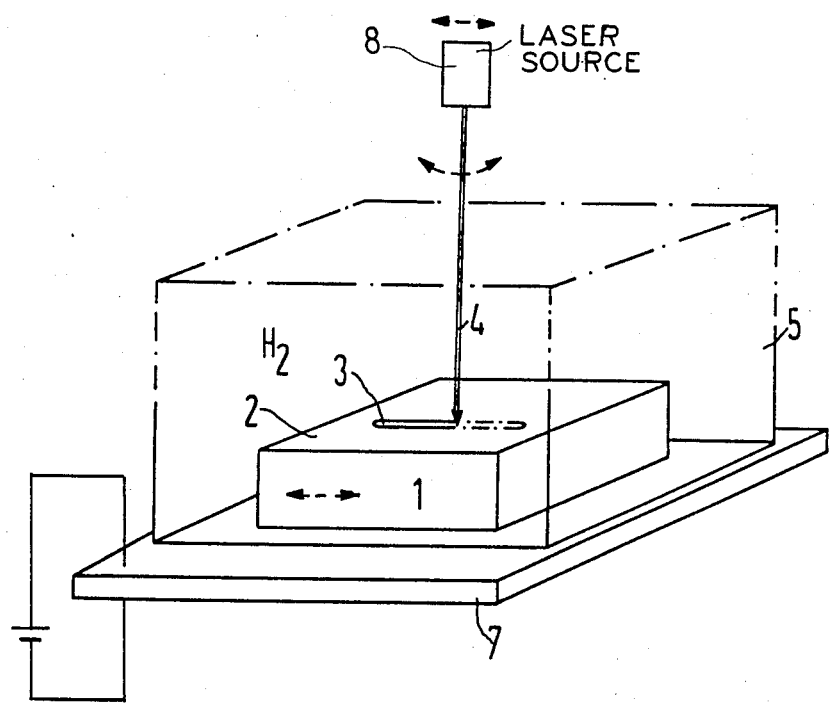

METHOD FOR GENERATING A CONDUCTIVE REGION ON A SURFACE OF A BODY OF DIELECTRIC MATERIAL

BACKGROUND OF THE INVENTION

1. Field of the Invention

The present invention relates to a method for generating areas of increased conductivity on the surface of a body of dielectric material, and in particular to a method for preparing the surface for connection of an electrode or other electrical interconnect to the area.

2. Description of the Prior Art

The use of electrical interconnections and/or electrode surfaces applied to bodies consisting of dielectric material, such as ceramic material, is well known. The use of brazing silver for this purpose is also known, this yielding electrically conductive layers having good adherence properties due to the composition of the brazing silver, particularly on metal oxide ceramic and crystalline material, particularly single-crystals.

Erosive working of material, particularly ceramic material, by means of laser radiation is also known. Drilling crystals for use as clock oscillators using laser radiation is described in U.S. Pat. No. 3,601,576. Such drilling may take place in oxidizing, reducing or neutral atmospheres, as needed. For processing ferrites, the laser radiation is used in a halomethane atmosphere, wherein the halogen portion is the determining factor for such etching.

Laser radiation has also been used for manufacturing low-impedance contacts on barium titanate. Such material must, however, be already in the form of semiconductive material in order to apply a metal contact having low electrical resistance thereto. Such a process is described in U.S. Pat. No. 4,261,764. The existing electrical conductivity of the semiconductive barium titanate is not changed by the application of such contacts.

Published European patent application No. 00 21 087 describes a method for producing electrical interconnects using laser radiation. As described therein, a body having a metal or alloy layer on a ceramic glass or silicon substrate is used. The metal or alloy layer has an amorphous structure and thus has little electrical conductivity. As a result of the applied laser radiation, a crystallization process takes place within the layer disposed above the substrate due to the heat of the laser radiation. This crystallization process permits the material of the metal or alloy layer to be converted from the amorphous into the coarse crystalline or single-crystalline state at the location of the laser radiation. The material of this layer has a higher conductivity in the crystalline state, so that electrical interconnects in such a layer, which is otherwise substantially electrically insulating, can be generated.

Perovskite oxide material is another important dielectric material, used in ceramic (polycrystalline) as well as single-crystal form. Barium titanate, strontium titanate, plumbous zirconate titanate as well as corresponding niobates, tantalates and the like are particularly useful in this regard. These materials are utilized in electronics as capacitor dielectric material, as piezo electric elements, and the like.

SUMMARY OF THE INVENTION

It is an object of the present invention to provide a method for generating areas of increased conductivity on the surface of a dielectric body.

It is a further object of the present invention to provide such a method for generating electrode surfaces on bodies of dielectric oxide ceramic material, dielectric single crystal material, and particularly perovskite material.

The above objects are inventively achieved in a method wherein a selected portion of the surface of a dielectric oxide material is enclosed in a reducing atmosphere and irradiated with laser radiation for a selected period of time.

The present invention makes use of the knowledge that, particularly with respect to barium titanate, electrical conductivity in the material occurs during tempering, such as during ceramic sintering of the material. In the case of barium titanate, such tempering or sintering is undertaken in an atmosphere having a lower oxygen content than atmospheric air. An oxygen depletion occurs in the material, resulting in n-type semiconductor conductivity.

The above knowledge is utilized in the present method to achieve a thin-film generated conductive region for attaching electrodes or functioning as an electrode surface on the body of dielectric oxide material.

The laser irradiation to achieve the area of increased conductivity in accordance with the principles of the present invention is undertaken in an atmosphere having a reducing effect for the oxide material at higher temperatures. A hydrogen atmosphere having a partial pressure in the range of 0 through $10^3$ HPa is used. The method may also be undertaken in a vacuum. A protective atmosphere consisting of nitrogen and hydrogen having a partial hydrogen pressure in the above-specified range may also be employed. It is preferable to pre-heat the dielectric body which is to be irradiated in a range of 200° through 300° C. during laser irradiation.

Ultraviolet or visible laser radiation such a from an argon laser or a krypton ion laser is preferably employed for fine strips, for example in the micrometer range. $CO_2$ lasers and Nd:YAG lasers are preferably employed for generating relatively larger structures having, for example, dimensions in the millimeter range or for increasing the conductivity of the entire electrode surface. Barium titanate, strontium titanate and plumbous titanate zircon (PZT) have been processed in this manner.

The width and depth of the strips which become electrically conductive as a result of the aforementioned laser irradiation substantially correspond to the size of the diameter to $2w_o$ of the focused laser spot on the material surface. Values having a few micrometers in diameter, for example, may be used. Given a corresponding output of the laser, values in the millimeter range may also be considered. It must further be considered that the conductivity of the strip produced increases considerably as the laser radiation power is increased, given constant irradiation spot size and a constant feed rate. For example, a dc resistance per length unit on the order of magnitude between 12k Ohm/mm and 2k Ohm/mm results for strontium titanate in a hydrogen atmosphere at 100 HPa given a spot diameter 2 $w_o$=42 μm, and a feed rate of 42 μm per second at a laser power in the range between 0.9 watts and 1.3 watts using an argon ion laser at a wavelength of 488 nm. This corresponds to a change in the specific resistance of the substrate material by a factor of $10^{12}$. Clearly, sufficient electrical conductivity for electrical interconnects and electrodes is achieved by this method. The exact values can be selected as needed.

The examples cited above preferably are for single crystal material, such as strontium titanate and barium titanate. Values of the laser operation may be varied, however, within the framework of the invention in dependence upon the material to be processed. A laser radiation power between 200 mW an 600 mW given, for example, a feed of 10 $\mu$m/s is particularly suitable for plumbous zirconate titanate ceramic material. Resistance values per unit length are thereby achieved as small as 10 Ohm/mm. The resulting reduction in the resistance per length depends roughly logarithmically on the laser radiation power, which may be used as a guideline.

DESCRIPTION OF THE DRAWINGS

The single FIGURE is a perspective view showing implementation of the method in accordance with the principles of the present invention.

DESCRIPTION OF THE PREFERRED EMBODIMENTS

As shown in the single drawing, a body of dielectric oxide material is referenced at 1. An area 3 of increased conductivity for the purpose of serving as an electrical interconnect region is shown on the surface 2 of the body 1. A radiation with a laser beam 4 takes place along the selected area 3 either by moving a laser source 8 or by moving the body 1. Preferably the body 1 is moved for this purpose relative to the laser beam 4. If the laser beam 4 is moved, this can be accomplished by moving the laser source so as to sweep the region 3, or by maintaining a stationary source with controlled deflection of the beam 4.

At least the surface 3 of the body 1 is contained within a housing 5 in which a selected atmosphere and pressure are maintained during irradiation, for example a hydrogen atmosphere at a pressure between 0 and 1000 HPa.

The body 1 may be disposed on a plate 7 connected to a power source for pre-heating the body 1.

The inventive method of laser irradiation in an atmosphere with reducing effect may be accompanied by an additional metal-deposition. The atmosphere used may contain an added gaseous component of one or more metal or metal compounds. This metal compound may be a metal organic compound, for instance a metal alcyl or a metal carbonyl.

Although modifications and changes may be suggested by those skilled in the art it is the intention of the inventor to embody within the patent warranted hereon all changes and modifications as reasonably and properly come within the scope of his contribution to the art.

I claim as my invention:

1. A method for generating a conductive region on a surface of a body of dielectric oxide material comprising the steps of:
    selecting said material from the group consisting of single-crystal perovskite oxide and ceramic perovskite oxide;
    enclosing said surface in a reducing atmosphere; and
    irradiating a portion of said surface corresponding to the conductive region to be generated with laser radiation for a selected period of time.

2. A method as claimed in claim 1 wherein said reducing atmosphere is maintained above room temperature.

3. A method as claimed in claim 1 wherein said reducing atmosphere is a hydrogen atmosphere at a pressure in a range of 0-1000 HPa.

4. A method as claimed in claim 1 wherein said reducing atmosphere partially consists of hydrogen at a partial pressure in the range of 0-1000 HPa.

5. A method as claimed in claim 1 comprising the additional step of pre-heating said body before irradiation with said laser.

6. A method as claimed in claim 1 wherein the step of irradiating with a laser is further defined by the step of irradiating a portion of said surface corresponding to the conductive region to be generated with laser radiation for a selected period of time from a laser selected from the group consisting of an argon laser and a krypton laser.

7. A method as claimed in claim 1 wherein the step of irradiating said surface is further defined by irradiating said surface with a $CO_2$ laser.

8. A method as claimed in clam 3 wherein said hydrogen atmosphere is at a pressure of 100 HPa.

9. A method as claimed in claim 5 wherein the step of pre-heating is further defined by pre-heating said body at a temperature in the range of 200°-300° C.

10. A method as claimed in claim 6 further comprising the additional step of pre-heating said body before irradiation with said laser.

11. A method for generating a conductive region on a surface of a body of dielectric oxide material comprising the steps of:
    selecting said material from the group consisting of single-crystal perovskite oxide and ceramic perovskite oxide;
    heating said surface;
    enclosing said surface in a reducing atmosphere at a selected pressure; and
    irradiating said surface at a selected area corresponding to the desired conductive region with a laser for a selected period of time.

12. A method as claimed in claim 11 wherein the step of irradiating said surface with a laser is further defined by irradiating said surface at a selected area corresponding to the desired conductive region with a laser for a selected period of time selected from the group of an argon laser and a krypton laser.

13. A method as claimed in claim 11 wherein the step of irradiating said surface with a laser is further defined by irradiating said surface with a $CO_2$ laser.

14. A method as claimed in claim 11 wherein said reducing atmosphere is a hydrogen atmosphere.

15. A method as claimed in claim 11 wherein the step of heating said surface is further defined by heating said surface at a temperature in a range of 200°-300° C.

16. A method for generating a conductive region on a surface of a body of dielectric oxide material comprising the steps of:
    selecting said material from the group consisting of single-crystal perovskite oxide and ceramic perovskite oxide;
    enclosing said surface in a reducing atmosphere at least partially consisting of hydrogen at a selected pressure;
    heating said surface in a range of 200°-300°; and
    irradiating said surface with a laser at at least one location thereon corresponding to said electrically conductive region.

17. A method as claimed in claim 16 wherein said reducing atmosphere consists at least partially of hydrogen at a pressure in the range of 0-1000 HPa.

* * * * *